United States Patent
Li et al.

(10) Patent No.: US 12,379,426 B2
(45) Date of Patent: Aug. 5, 2025

(54) LEAKAGE CURRENT DETECTION AND INTERRUPTION DEVICE AND RELATED ELECTRICAL CONNECTORS AND ELECTRICAL APPLIANCES

(71) Applicant: Chengli Li, Suzhou (CN)

(72) Inventors: Chengli Li, Suzhou (CN); Long Chen, Suzhou (CN)

(73) Assignee: Chengli Li, Suzhou (CN)

( * ) Notice: Subject to any disclaimer, the term of this patent is extended or adjusted under 35 U.S.C. 154(b) by 160 days.

(21) Appl. No.: 18/493,584

(22) Filed: Oct. 24, 2023

(65) Prior Publication Data

US 2025/0123338 A1    Apr. 17, 2025

(30) Foreign Application Priority Data

Oct. 16, 2023 (CN) .......................... 202311333130.2
Oct. 16, 2023 (CN) .......................... 202322763594.9

(51) Int. Cl.
| | |
|---|---|
| *H02H 1/00* | (2006.01) |
| *G01R 31/52* | (2020.01) |
| *H02H 3/05* | (2006.01) |
| *H02H 3/16* | (2006.01) |
| *H02H 3/33* | (2006.01) |
| *H02H 5/04* | (2006.01) |

(52) U.S. Cl.
CPC .......... *G01R 31/52* (2020.01); *H02H 1/0007* (2013.01); *H02H 3/05* (2013.01); *H02H 3/16* (2013.01); *H02H 3/335* (2013.01); *H02H 5/047* (2013.01)

(58) Field of Classification Search
CPC ........ G01R 31/52; H02H 1/0007; H02H 3/05; H02H 3/16; H02H 3/335; H02H 5/047

USPC .................................. 361/24, 30, 31, 32, 42
See application file for complete search history.

(56) References Cited

U.S. PATENT DOCUMENTS

2009/0251832 A1* 10/2009 Brugner ............. H01R 13/6683
361/103
2015/0349512 A1* 12/2015 Li ........................... H02H 5/04
361/47

(Continued)

FOREIGN PATENT DOCUMENTS

KR     100817332 B1 *  3/2008

*Primary Examiner* — Danny Nguyen
*Assistant Examiner* — Nicolas Bellido
(74) *Attorney, Agent, or Firm* — Chen Yoshimura LLP

(57) ABSTRACT

A leakage current detection and interruption device includes a switch module for connecting and disconnecting input and output ends of current carrying lines; a leakage current detection module for detecting a leakage current signal on the current carrying lines and generating a leakage fault signal in response thereto; an over-temperature protection module for detecting a temperature of a predefined location and/or component of the device and generating an over-temperature fault signal when the detected temperature exceeds a predetermined temperature threshold; a drive module for driving the switch module to disconnect the electrical connection in response to the leakage fault signal and/or over-temperature fault signal; and a self-test module for periodically generating a simulated leakage current signal to detect a malfunction in the leakage current detection module and/or drive module, and generating a self-test fault signal when detecting the malfunction. The device has a simple structure, is low cost and safe.

16 Claims, 9 Drawing Sheets

(56) References Cited

U.S. PATENT DOCUMENTS

| | | | |
|---|---|---|---|
| 2015/0349517 A1* | 12/2015 | Li | H02H 5/04 |
| | | | 361/103 |
| 2020/0091707 A1* | 3/2020 | Li | H02H 1/0007 |
| 2020/0366083 A1* | 11/2020 | Li | H02H 1/0007 |
| 2021/0313796 A1* | 10/2021 | Li | H02H 1/0007 |
| 2025/0141207 A1* | 5/2025 | Li | H02H 3/162 |

* cited by examiner

LEAKAGE CURRENT DETECTION AND INTERRUPTION DEVICE AND RELATED ELECTRICAL CONNECTORS AND ELECTRICAL APPLIANCES

BACKGROUND OF THE INVENTION

This invention relates to electrical circuits, and in particular, it relates to a leakage current detection and interruption device, and related electrical connectors and electrical appliances.

With increased safety awareness, more and more consumers install electrical fault detection and protection devices in their homes, such as ground fault circuit interrupter devices (GFCI), arc fault circuit interrupter devices (AFCI), portable residual current protective device (PRCD), etc.

However, many such circuit interrupter devices only have a tripping function that can disconnect power at the output end in response to a leakage current; they cannot provide protection functions when the device has other abnormal conditions such as overload, overheating of the insertion plates, etc., which presents a hidden safety threat.

SUMMARY OF THE INVENTION

To solve the above problem, the present invention provides a leakage current detection and interruption device, which includes: a switch module, coupled on a plurality of current carrying lines between an input end and an output end, configured to connect or disconnect an electrical connection between the input end and the output end; a leakage current detection module, configured to detect a leakage current signal on the plurality of current carrying lines and to generate a leakage fault signal in response to detecting the leakage current signal; an over-temperature protection module, configured to detects a temperature of a predefined location and/or a predefined component of the leakage current detection and interruption device, and to generate an over-temperature fault signal when the detected temperature exceeds a predetermined temperature threshold; a drive module, coupled to the switch module, the leakage current detection module, and the over-temperature protection module, configured to receive the leakage fault signal and/or the over-temperature fault signal, and to drive the switch module to disconnect the electrical connection in response to the leakage fault signal and/or the over-temperature fault signal; and a self-test module, coupled to the leakage current detection module and the drive module, configured to periodically generate a simulated leakage current signal to detect a malfunction in the leakage current detection module and/or the drive module, and to generate a self-test fault signal in response to detecting the malfunction of the leakage current detection module and/or the drive module.

In some embodiments, the over-temperature protection module includes at least one temperature sensor disposed at the predefined location and/or on a surface of the predefined component.

In some embodiments, the at least one temperature sensor includes a thermistor, a diode, and/or a bimetal switch.

In some embodiments, the at least one temperature sensor includes a thermistor, the over-temperature protection module includes a first voltage-triggered sub-module and at least one voltage divider element, wherein the at least one voltage divider element is coupled in series with the thermistor and coupled to the first voltage-triggered sub-module, the first voltage-triggered sub-module is coupled to the drive module, wherein when the thermistor detects that the temperature of the predefined location or predefined component exceeds a temperature threshold, the at least one voltage divider element provides an over-temperature detection signal to the first voltage-triggered sub-module, and the first voltage-triggered sub-module generates the over-temperature fault signal in response thereto.

In some embodiments, the over-temperature protection module further includes a voltage regulator, where the first voltage divider element and the thermistor are coupled in series and then coupled in parallel with the voltage regulator.

In some embodiments, the first voltage-triggered sub-module includes a trigger diode, a transistor, a field-effect transistor, and/or a comparator.

In some embodiments, the at least one temperature sensor includes a bimetal switch coupled to the drive module, wherein the bimetal switch closes in response to detecting that the temperature at the predefined location and/or predefined component exceeds the predetermined temperature threshold to generate the over-temperature fault signal.

In some embodiments, the self-test module includes a second voltage-triggered sub-module and a first capacitor coupled in series, wherein the first capacitor is charged by the current carrying lines and configured to periodically generate the simulated leakage current signal via the second voltage-triggered sub-module.

In some embodiments, the second voltage-triggered sub-module includes a trigger diode, a transistor, a field-effect transistor, and/or a comparator.

In some embodiments, the device further includes a monitor module, coupled to the leakage current detection module, wherein the monitor module includes a test switch and is configured to generate a simulated leakage fault signal in response to the test switch being operated, to detect whether the device is functioning normally.

In a second aspect, the present invention provides an electrical power connection device, which includes: a body; and a leakage current detection and interruption device according to any of the above embodiments, disposed inside the body.

In a second aspect, the present invention provides an electrical appliance, which includes: an electrical load; and an electrical power connection device coupled between a power supply and the electrical load, configured to supply power to the electrical load, wherein the electrical power connection device includes a leakage current detection and interruption device according to any of the above embodiments.

By providing the over-temperature protection module in the leakage current detection and interruption device, which can disconnect the power when there is an overloading or when the insertion plates have poor contact causing the internal temperature of the device to rise, the device can prevent hidden safety threat and dangerous conditions, thereby improving the safety of the device. The leakage current detection and interruption device according to embodiments of the present invention has a simple structure, is low cost and safe.

BRIEF DESCRIPTION OF DRAWINGS

Preferred embodiments of the present invention are described with reference to the drawings. These drawings explain the embodiments and their operating principle, and only illustrate structures that are necessary to the understanding of the invention. These drawings are not to scale. In the drawings, like features are designated by like reference symbols. In the block diagrams, lines between blocks

DETAILED DESCRIPTION OF THE INVENTION

Preferred embodiments of the present invention are described below with reference to the drawings. These drawings and descriptions explain embodiments of the invention but do not limit the invention. The described embodiments are not all possible embodiments of the present invention. Other embodiments are possible without departing from the spirit and scope of the invention, and the structure and/or logic of the illustrated embodiments may be modified. Thus, it is intended that the scope of the invention is defined by the appended claims.

Before describing the embodiments, some terms used in this disclosure are defined here to help the reader better understand this disclosure.

In this disclosure, terms such as "connect", "couple", "link" etc. should be understood broadly, without limitation to physical connection or mechanical connection, but can include electrical connection, and can include direct or indirection connections. Terms such as "a" and "one" do not limit the quantity, and refers to "at least one".

In the descriptions below, terms such as "including" are intended to be open-ended and mean "including without limitation", and can include other contents. "Based on" means "at least partly based on." "An embodiment" means "at least one embodiment." "Another embodiment" means "at least another embodiment," etc. In this disclosure, the above terms do not necessarily refer to the same embodiments. Further, the various features, structures, materials or characteristics may be suitably combined in any of the one or more embodiments. Those of ordinary skill in the art may combine the various embodiments and various characteristics of the embodiments described herein when they are not contrary to each other.

Embodiments of the present invention provide a leakage current detection and interruption device which includes an over-temperature protection module. This module can disconnect the power when there is an overloading or when the insertion plates have poor contact causing the internal temperature of the device to rise. This can prevent hidden safety threat and dangerous conditions, thereby improving the safety of the device. The leakage current detection and interruption device according to embodiments of the present invention has a simple structure, is low cost and safe.

Figure 1:
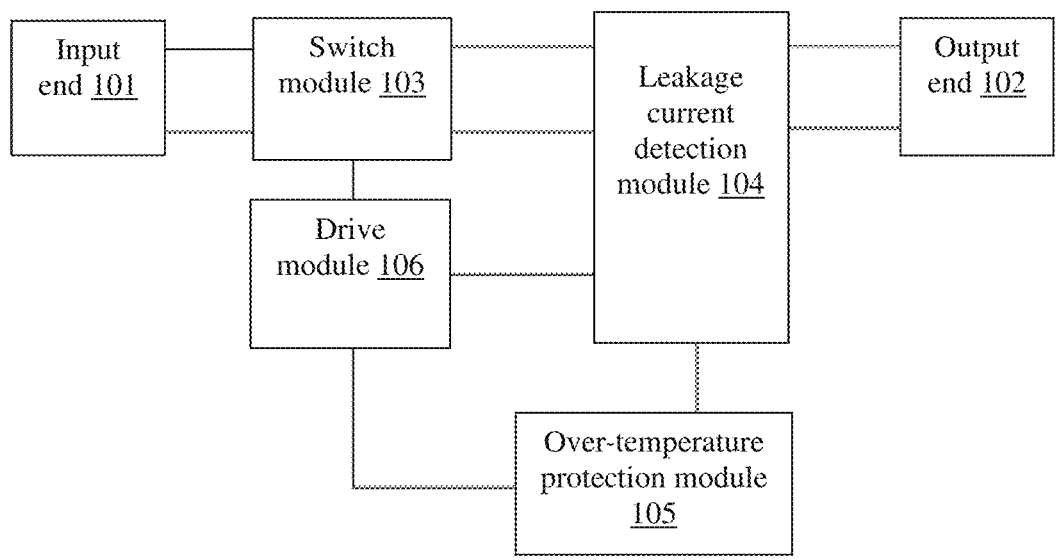
FIG. 1 is a block diagram illustrating a leakage current detection and interruption device according to embodiments of the present invention.

FIG. 1 is a block diagram illustrating a leakage current detection and interruption device according to embodiments of the present invention. As shown in FIG. 1, the leakage current detection and interruption device 100 includes a switch module 103, a leakage current detection module 104, an over-temperature protection module 105, and a drive module 106. The switch module 103 is coupled between the input end 101 and output end 102 of the power supply lines, and controls the electrical connection and disconnection btw the input and output ends. The power supply lines may include a first current carrying line (L) coupled to the hot line of the power source, and a second current carrying line (N) coupled to the neutral line of the power source. The leakage current detection module 104 functions to detect a leakage current signal on the current carrying lines, and to generate a leakage fault signal in response thereto. The over-temperature protection module 105 detects the temperature of predefined location and/or component of the leakage current detection and interruption device 100, and generates an over-temperature fault signal when the temperature exceeds a predetermined temperature threshold. The drive module 106 is coupled to the switch module 103, leakage current detection module 104 and over-temperature protection module 105, and functions to receive the leakage fault signal and/or the over-temperature fault signal, and to drive the switch module 103 to disconnect the power in response to the leakage fault signal and/or over-temperature fault signal.

The leakage current detection and interruption device 100 of this embodiment includes the over-temperature protection module, which can disconnect the power when there is an overloading or when the insertion plates have poor contact causing the internal temperature of the device to rise. This can prevent hidden safety threat and dangerous conditions, thereby improving the safety of the device. The leakage current detection and interruption device according to embodiments of the present invention has a simple structure, is low cost and safe.

In some embodiments, the over-temperature protection module 105 includes at least one temperature sensor disposed at predefined locations and/or on the surface of predefined components. The at least one temperature sensor may be a thermistor, a diode, and/or a bimetal switch. The leakage current detection and interruption device may employ a single temperature sensor to detect the temperature of a predefined location and/or predefined component, to reduce the cost and size of the leakage current detection and interruption device. Or, the leakage current detection and interruption device may employ multiple temperature sensors to detect the temperature of multiple predefined locations and/or predefined components, e.g., at different locations and/or of different components, and process the multiple detection results to obtain an overall detection result, which improves precision of the detection.

In some embodiments, the at least one temperature sensor includes a thermistor. The over-temperature protection module 105 includes a first voltage-triggered sub-module and at least one voltage divider element. The at least one voltage divider element is coupled in series with the thermistor, and coupled to the first voltage-triggered sub-module. The first voltage-triggered sub-module is further coupled to the drive module 106. When the thermistor detects that the temperature at the predefined location and/or predefined component exceeds the predetermined temperature threshold, the at least one voltage divider element provides an over-temperature detection signal to the first voltage-triggered sub-module, and the first voltage-triggered sub-module in turn generates the over-temperature fault signal. The voltage divider element may be a resistor, inductor, or capacitor.

In some embodiments, the over-temperature protection module 105 further includes a voltage regulator, where the first voltage divider element and the thermistor are coupled in series and then coupled in parallel with the voltage regulator. By using the voltage regulator, the voltage across the first voltage divider element and the thermistor is stabilized, thereby improving the accuracy of the predetermined temperature threshold. The first voltage-triggered sub-module includes a trigger diode, a transistor, a field-effect transistor, and/or a comparator.

In some embodiments, the at least one temperature sensor includes a bimetal switch coupled to the drive module; when the bimetal switch detects that the temperature at the predefined location and/or predefined component exceeds the predetermined temperature threshold, the bimetal switch closes, thereby generating the over-temperature fault signal.

In some embodiments, the leakage current detection and interruption device further includes a self-test module, coupled to the leakage current detection module 104 and drive module 106, and functions to periodically generate a simulated leakage current signal (i.e. self-test signal) to test whether the leakage current detection module 104 and/or drive module 106 has a malfunction, and to generate a self-test fault signal if the leakage current detection module 104 and/or drive module 106 has a malfunction.

In some embodiments, the self-test module includes a second voltage-triggered sub-module and a first capacitor coupled in series. The first capacitor is charged by the current carrying lines, and periodically generates the simulated leakage current signal via the second voltage-triggered sub-module. The second voltage-triggered sub-module includes a trigger diode, a transistor, a field-effect transistor, and/or a comparator.

In some embodiments, the leakage current detection and interruption device 100 further includes a monitor module, coupled to the leakage current detection module 104 and including a test switch. When the test switch is manually operated, the monitor module generates a simulated leakage fault signal to detect whether the leakage current detection and interruption device is functioning normally.

Figure 2:
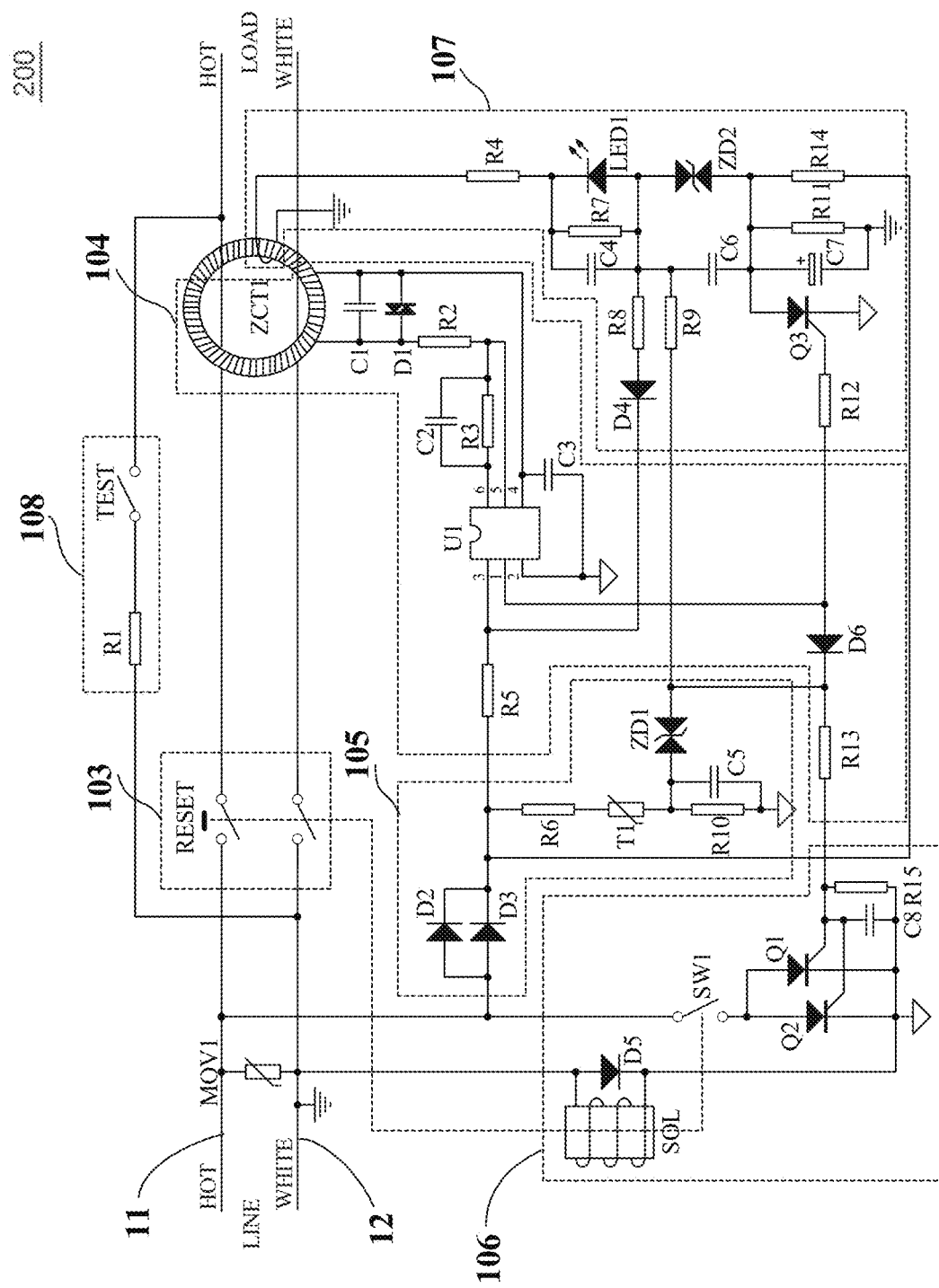
FIG. 2 is a circuit diagram of a leakage current detection and interruption device according to a first embodiment of the present invention.

FIG. 2 is a circuit diagram of a leakage current detection and interruption device 200 according to a first embodiment of the present invention.

As shown in FIG. 2, the leakage current detection and interruption device 200 is coupled between the input end LINE and output end LOAD of the current carrying lines, and includes a switch module 103, a leakage current detection module 104, an over-temperature protection module 105, a drive module 106, a self-test module 107, and a monitor module 108. The current carrying lines include a first current carrying line L (HOT) 11 and a second current carrying line N (WHITE) 12. The leakage current detection module 104 includes a zero sequence current transformer ZCT1 and a leakage current detection chip U1 along with its peripheral circuit elements, where the first current carrying line 11 and the second current carrying line 12 pass through the zero sequence current transformer ZCT1. The switch module 103 includes a reset switch RESET, which functions to control the electrical connection of the current carrying lines. The over-temperature protection module 105 includes diodes D2 and D3 coupled in parallel; resistor R6, thermistor T1 and resistor R10 (first voltage dividing element) coupled in series; and a trigger diode ZD1 (first voltage-triggered sub-module). The drive module 106 includes a switch drive element (such as a solenoid SOL), two silicon controlled rectifiers Q1 and Q2, and an auxiliary switch SW1. The auxiliary switch SW1 is mechanically linked to the reset switch RESET so that they open and close at the same time. The self-test module 107 includes trigger diode ZD2, capacitor C7 (first capacitor), silicon controlled rectifier Q3, resistor R7, capacitor C4, a light emitting diode LED1 coupled in parallel with resistor R7 and capacitor C4 and in series with capacitor C7, and peripheral circuit elements. In some other embodiments, the silicon controlled rectifier Q3 may be omitted, and the self-test module 107 shares silicon controlled rectifier Q1 and/or Q2 with the drive module 106, i.e., the silicon controlled rectifier Q1 and/or Q2 is coupled in parallel with capacitor C7 to provide a discharge path when the silicon controlled rectifier is conductive. The monitor module 108 includes resistor R1 and test switch TEST coupled in series.

When the leakage current detection and interruption device 200 is performing leakage current detection, the reset switch RESET and auxiliary switch SW1 are both closed. When the currents on the first current carrying line 11 and second current carrying line 12 are balanced, the zero sequence current transformer ZCT1 does not detect a current imbalance. When the first current carrying line 11 or second current carrying line 12 has a leakage current, the zero sequence current transformer ZCT1 detects the leakage current and generates a corresponding induction signal at its secondary winding. The zero sequence current transformer ZCT1 is coupled to the leakage current detection chip U1 to transfer the induction signal to the leakage current detection chip U1 for processing. When the processed leakage current signal is higher than a preset threshold, pin 1 of the leakage current detection chip U1 outputs a high voltage level (the leakage fault signal); otherwise, it outputs a low voltage signal. The high voltage level at pin 1 is provided via diode D6 and resistor R13 to the control electrodes of silicon controlled rectifier Q1 and Q2, triggering silicon controlled rectifier Q1 and/or Q2 to become conductive. As a result, a current flows through the solenoid SOL, generating a sufficiently large electromagnetic force to drive the reset switch RESET of the switch module 103 to disconnect the electrical connection between the input and output ends, and to open the auxiliary switch SW1 at the same time.

The leakage current detection and interruption device 200 has a self-test function. A current from the first current carrying line 11 charges capacitor C7 via the current path 11-D2/D3-R14. As the voltage across capacitor C7 rises, the voltage across the trigger diode ZD2 rises with it. After a predetermined time period, the voltage across the trigger diode ZD2 reaches its trigger voltage, triggering it to become conductive. As a result, a current flows through the path C7-LED1-R4 to generate a simulated leakage current. The voltage on capacitor C7 also supplies power to the leakage current detection chip U1 (during the negative half-cycle of the AC current) via R8-D4, and charges capacitor C8 via resistors R9-R13. When the leakage current detection and interruption device 200 functions normally, i.e., both the leakage current detection module 104 and drive module 106 function normally, when the zero sequence current transformer ZCT1 detects the simulated leakage current, it generates a corresponding induction signal at its secondary winding and transfers the signal to the leakage current detection chip U1, causing leakage current detection chip U1 to output a high voltage level at pin 1, triggering silicon controlled rectifier Q3 to become conductive. At this time, capacitor C7 is rapidly discharged via silicon controlled rectifier Q3 and solenoid SOL, and the voltage across it drops rapidly. When the voltage drops to below the trigger voltage of the trigger diode ZD2, the trigger diode ZD2 turns off. The time period of this process is relatively short. By setting the capacitances of capacitors C4 and C8, the voltages across capacitors C4 and C8 rise slowly during this time period, and remain relatively low, such that they are insufficient to cause the light emitting diode LED1 to emit light and insufficient to trigger silicon controlled rectifiers Q1 and Q2 to become conductive, so as not to affect the normal function of the device 200. Therefore, during this process the light emitting diode LED1 does not emit light, and switch module 103 does not trip (i.e., it remains closed).

When the leakage current detection module 104 malfunctions and cannot detect the simulated leakage current, pin 1 of leakage current detection chip U1 remains at the low voltage level. Therefore, silicon controlled rectifier Q3 is not triggered to conduct, so capacitor C7 cannot discharge via silicon controlled rectifier Q3 and solenoid SOL. As a result, trigger diode ZD2 remains conductive for a long time period, allowing a current to continuously charge capacitors C4 and C8 via current path C7-C6-R9-R13 (i.e., a self-test fault signal is produced). When the voltages across capacitors C4 and C8 rise to certain levels, sufficient to trigger the light emitting diode LED1 to emit light and sufficient to trigger silicon controlled rectifiers Q1 and Q2 to conduct, the light emitting diode LED1 emits light (i.e. alarm signal). If the drive module 106 functions normally, then silicon controlled rectifiers Q1 and/or Q2 become conductive; as a result, a current flows through the solenoid SOL, generating a sufficiently large electromagnetic force to drive the reset switch RESET of the switch module 103 to disconnect the electrical connection between the input and output ends. But if the drive module 106 also malfunctions, e.g. the solenoid SOL is an open circuit, then the switch module 103 remains closed.

If the leakage current detection module 104 functions normally but the drive module 106 malfunctions, e.g. the solenoid SOL is an open circuit, when the zero sequence current transformer ZCT1 detects the simulated leakage current and generates a corresponding induction signal at its secondary winding and transfers it to leakage current detection chip U1, leakage current detection chip U1 outputs a high voltage level at pin 1, triggering silicon controlled rectifier Q3 to become conductive. But because the solenoid SOL is an open circuit, capacitor C7 cannot discharge via the path of silicon controlled rectifier Q3 and solenoid SOL. As a result, trigger diode ZD2 remains conductive for a long time period, allowing a current to continuously charge capacitors C4 and C8 via current path C7-C6-R9-R13 (i.e., a self-test fault signal is produced). Thus, the voltages across capacitors C4 and C8 rise to certain levels, sufficient to trigger the light emitting diode LED1 to emit light (i.e. the alarm signal) and to trigger silicon controlled rectifiers Q1 and Q2 to conduct. In this condition, the light emitting diode LED emits light and the switch module 103 remains closed.

As capacitor C7 is further discharged, trigger diode ZD2 turns off, so light emitting diode LED1 is extinguished. The current again charges capacitor C7 via current path 11-D2/D3-R14; as the voltage across capacitor C7 rises again, trigger diode ZD2 is again conductive, and light emitting diode LED1 again emits light. This process repeats itself, with the result that light emitting diode LED1 flashes, i.e. a flashing light signal is generated to warn the user.

The leakage current detection and interruption device 200 further has an over-temperature protection function. The thermistor T1 is disposed at a predefined location or on the surface of a predefined component in the leakage current detection and interruption device 200. The predefined location may be, for example, on the printer circuit board PCB, a location inside the shell near the insertion plates, etc. The predefined component may be, for example, the solenoid SOL or other components of the electrical circuit. When the leakage current detection and interruption device 200 is functioning normally, e.g., there is no overloading or poor connection of the insertion plates, the temperature at the predefined location or predefined component is relatively low, so the thermistor T1 has a relatively high resistance; as current flows from first current carrying line 11 via D2/D3-R6-T1-R10 to ground, the voltage at the upper end of resistor R10 is relatively low and does not reach the trigger voltage of the trigger diode ZD1, so the trigger diode ZD1 is not conductive. When the leakage current detection and interruption device 200 malfunctions, for example, when there is an overload in the circuit or the insertion plates have poor contact, causing the temperature at the predefined location and/or predefined component to rise, the resistance of thermistor T1 drops, and the voltage at the upper end of resistor R10 rises accordingly. When the temperature at the predefined location and/or predefined component exceeds the temperature threshold, the voltage at the upper end of resistor R10 exceeds the trigger voltage of the trigger diode ZD1, i.e., it provides an over-temperature detection signal to the trigger diode ZD1. The trigger diode ZD1 is triggered to conduct, and a current (over-temperature fault signal) flows through ZD1 and R13 to trigger silicon controlled rectifiers Q1 and/or Q2 to conduct; as a result, a current flows through the solenoid SOL, generating a sufficiently large electromagnetic force to drive the reset switch RESET of the switch module 103 to disconnect the electrical connection between the input and output ends.

Further, the leakage current detection and interruption device 200 of FIG. 2 can test the leakage current detection and interruption function. When performing the test, the reset switch RESET is closed. The user manually closes the test switch TEST of the monitor module 108, forming a current path from first current carrying line 11 via resistor R1 to second current carrying line 12 to generate a simulated leakage current. The zero sequence current transformer ZCT1 detects this simulated leakage current and generates a corresponding induction signal, and transfers it to the leakage current detection chip U1. When the simulated leakage current is larger than a preset threshold, pin 1 of leakage current detection chip U1 outputs a high voltage level (leakage fault signal). The signal at pin 1 is provided to the control electrodes of silicon controlled rectifiers Q1 and Q2, triggering silicon controlled rectifiers Q1 and/or Q2 to become conductive. As a result, a current flows through the solenoid SOL, generating a sufficiently large electromagnetic force to drive the reset switch RESET of the switch module 103 to disconnect the electrical connection between the input and output ends. On the other hand, if in response to the test switch TEST being closed, the reset switch RESET does not disconnect the electrical connection between the input and output ends, then it indicates that the leakage current protection function of the leakage current detection and interruption device 200 is lost, i.e. one or both of leakage current detection module 104 and drive module 106 is malfunctioning. By using the monitor module 108 to perform the test, malfunction in the leakage current detection and interruption device 200 can be discovered, reminding the user to replace the device.

Figure 3:
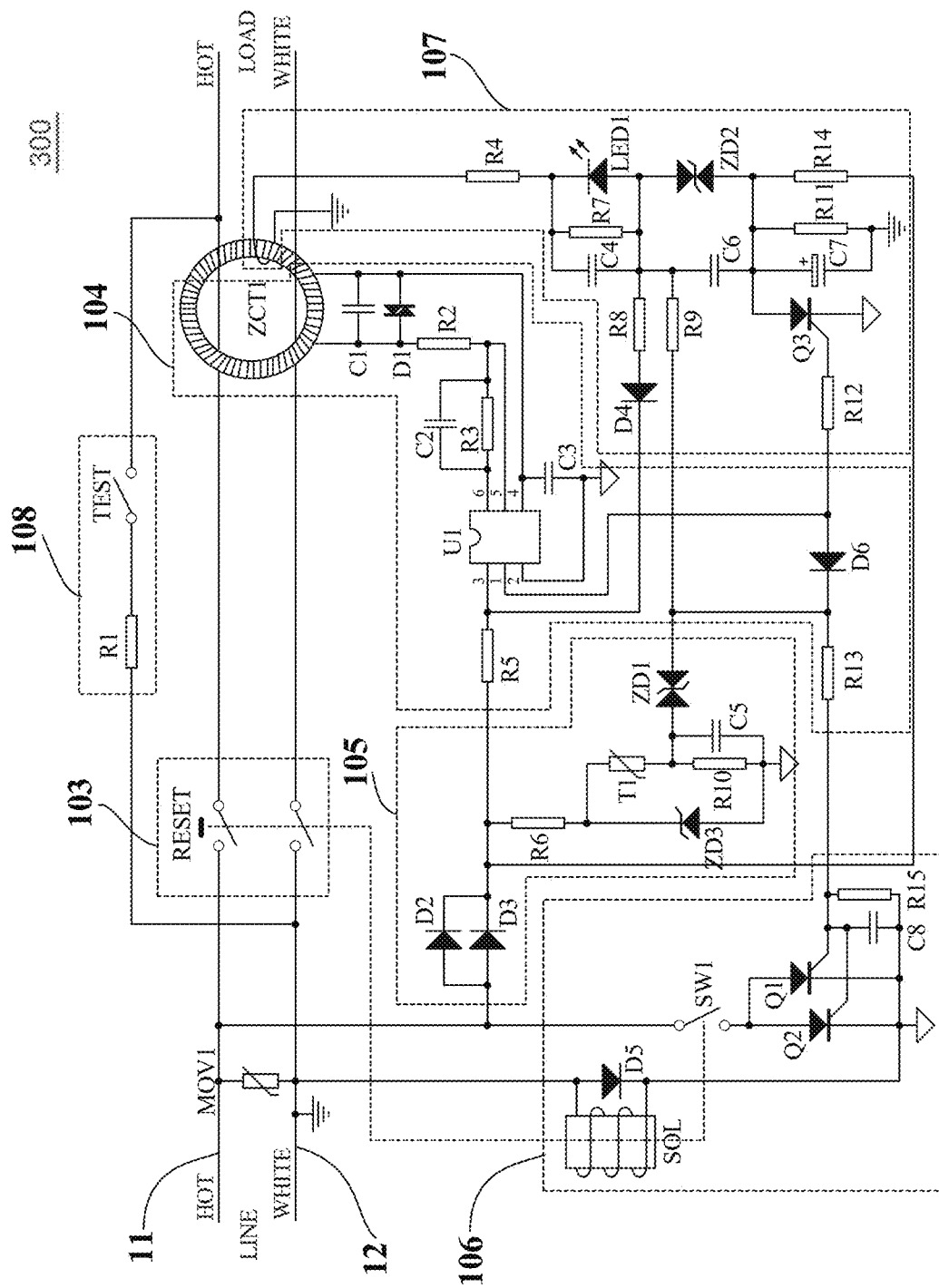
FIG. 3 is a circuit diagram of a leakage current detection and interruption device according to a second embodiment of the present invention.

FIG. 3 is a circuit diagram of a leakage current detection and interruption device 300 according to a second embodiment of the present invention. Compared to the embodiment in FIG. 2, a main difference is that in the embodiment of FIG. 3, a voltage regulator ZD3 is coupled in parallel with the serial-connected thermistor T1 and resistor R10. The leakage current detection and interruption function, self-test function, test function and over-temperature protection function are similar to those of the embodiment of FIG. 2 and further descriptions are omitted.

In the embodiment of FIG. 3, under the action of voltage regulator ZD3, the voltage across thermistor T1 and resistor R10 is stabilized, which reduces the impact of the variation of the resistance of resistor R6 due to temperature change or voltage change on the input end of the current carrying lines. This improves the precision of the predetermined temperature threshold, and improves the stability and safety of the over-temperature protection function of the leakage current detection and interruption device 300.

Figure 4:
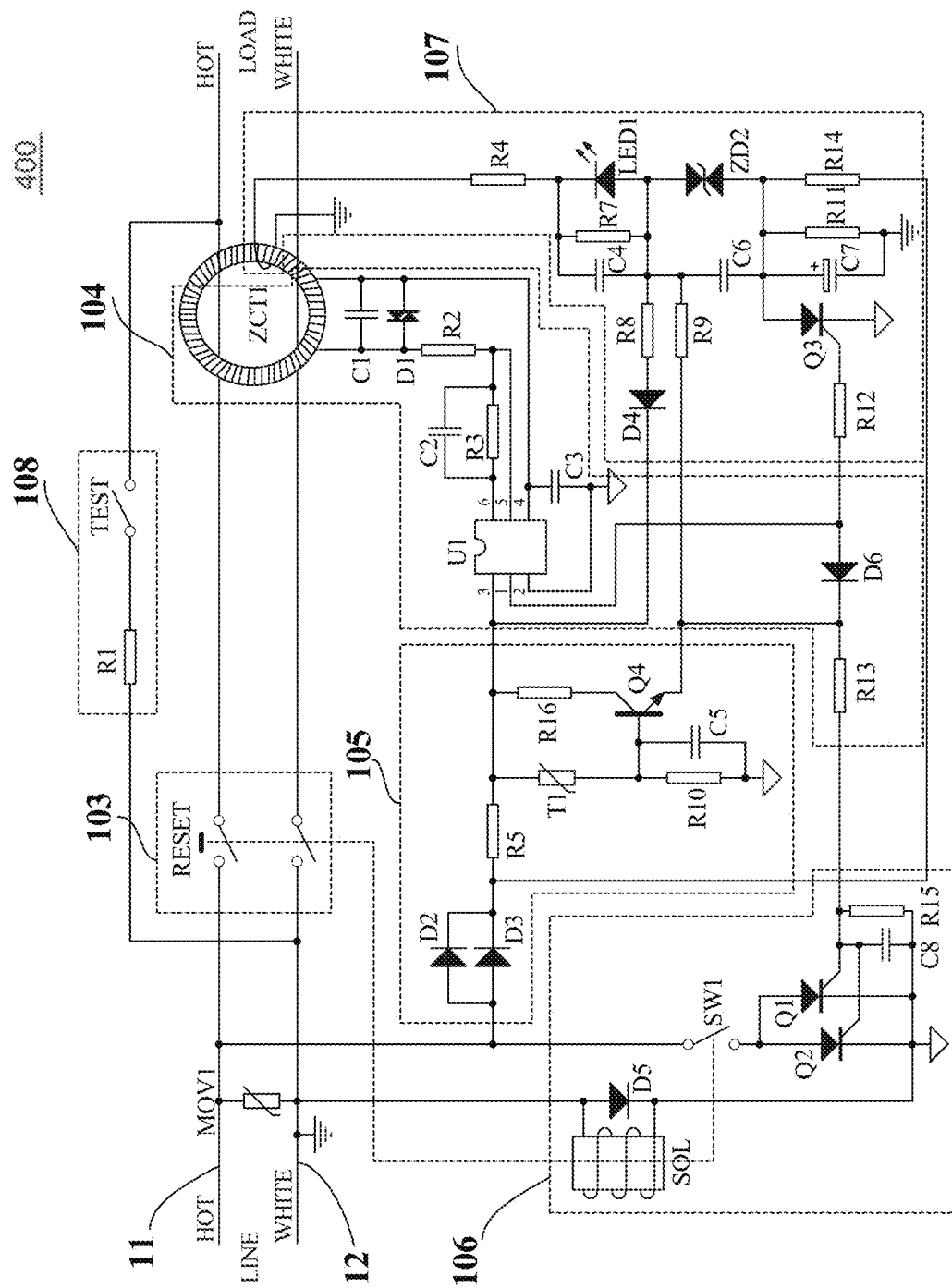
FIG. 4 is a circuit diagram of a leakage current detection and interruption device according to a third embodiment of the present invention.

FIG. 4 is a circuit diagram of a leakage current detection and interruption device 400 according to a third embodiment of the present invention. Compared to the embodiment of FIG. 2, a main difference is that in the embodiment of FIG. 4, the leakage current detection and interruption device 400 uses a transistor Q4 to replace the trigger diode ZD1. The leakage current detection and interruption function, self-test function, and test function are similar to those of the embodiment of FIG. 2 and further descriptions are omitted.

When the leakage current detection and interruption device 400 is functioning normally, e.g., there is no overloading or poor connection of the insertion plates, the temperature at the predefined location or predefined component is relatively low, so the thermistor T1 has a relatively high resistance; as current flows from first current carrying line 11 via D2/D3-R5-T1-R10 to ground, the voltage at the upper end of resistor R10 is relatively low and does not reach the trigger voltage of transistor Q4, so transistor Q4 is not conductive. When the leakage current detection and interruption device 400 malfunctions, for example, when there is an overload in the circuit or the insertion plates have poor contact, causing the temperature at the predefined location and/or predefined component to rise, the resistance of thermistor T1 drops, and the voltage at the upper end of resistor R10 rises accordingly. When the temperature at the predefined location and/or predefined component exceeds the temperature threshold, the voltage at the upper end of resistor R10 exceeds the trigger voltage of transistor Q4, i.e., it provides an over-temperature detection signal to transistor Q4. Transistor Q4 is triggered to conduct, and a current (over-temperature fault signal) flows through Q4 and R13 to trigger silicon controlled rectifiers Q1 and/or Q2 to conduct; as a result, a current flows through the solenoid SOL, generating a sufficiently large electromagnetic force to drive the reset switch RESET of the switch module 103 to disconnect the electrical connection between the input and output ends.

Figure 5:
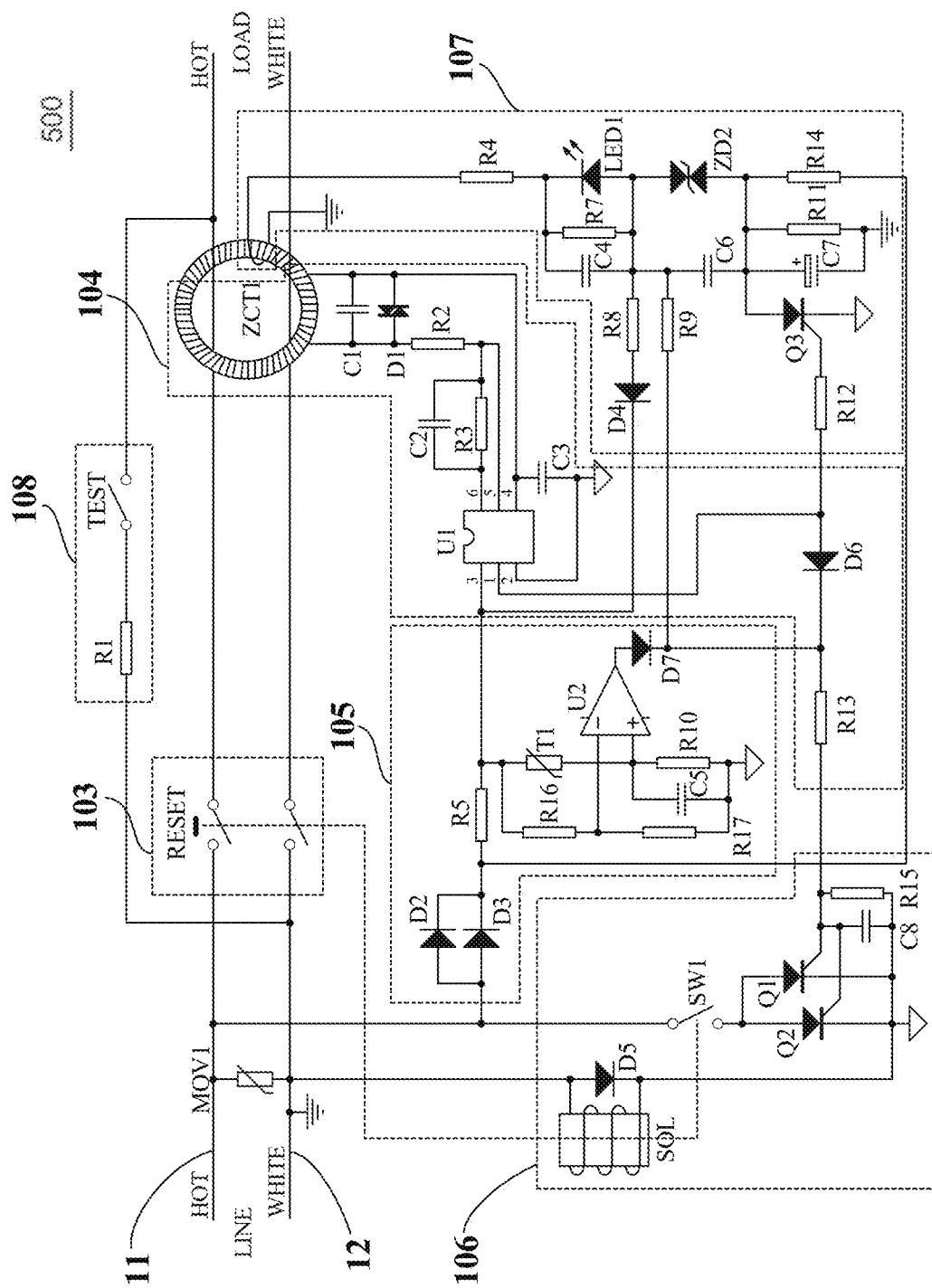
FIG. 5 is a circuit diagram of a leakage current detection and interruption device according to a fourth embodiment of the present invention.

FIG. 5 is a circuit diagram of a leakage current detection and interruption device 500 according to a fourth embodiment of the present invention. Compared to the embodiment of FIG. 2, a main difference is in the over-temperature protection module 105. The leakage current detection and interruption function, self-test function, and test function are similar to those of the embodiment of FIG. 2 and further descriptions are omitted.

In the leakage current detection and interruption device 500, the over-temperature protection module 105 includes diodes D2 and D3 coupled in parallel; resistor R5, thermistor T1 and resistor R10 (first voltage dividing element) coupled in series; resistors R16, R17 coupled in series and comparator U2 (first voltage-triggered sub-module). The upper end of resistor R10 is coupled to the non-inverting input of comparator U2, and the upper end of resistor R17 is coupled to the inverting input of comparator U2, and the upper end of resistor R17 is used as the reference voltage of comparator U2.

When the leakage current detection and interruption device 500 is functioning normally, e.g., there is no overloading or poor connection of the insertion plates, the temperature at the predefined location or predefined component is relatively low, so the thermistor T1 has a relatively high resistance; as current flows from first current carrying line 11 via D2/D3-R5-T1-R10 to ground, the voltage at the upper end of resistor R10 is relatively low, lower than the voltage at the upper end of resistor R17 (reference voltage), so comparator U2 outputs a low voltage level. When the leakage current detection and interruption device 500 malfunctions, for example, when there is an overload in the circuit or the insertion plates have poor contact, causing the temperature at the predefined location and/or predefined component to rise, the resistance of thermistor T1 drops, and the voltage at the upper end of resistor R10 rises accordingly. When the temperature at the predefined location and/or predefined component exceeds the temperature threshold, the voltage at the upper end of resistor R10 exceeds the reference voltage, i.e., it provides an over-temperature detection signal to comparator U2. Comparator U2 outputs a high voltage laten (over-temperature fault signal) to trigger silicon controlled rectifiers Q1 and/or Q2 to conduct; as a result, a current flows through the solenoid SOL, generating a sufficiently large electromagnetic force to drive the reset switch RESET of the switch module 103 to disconnect the electrical connection between the input and output ends.

Figure 6:
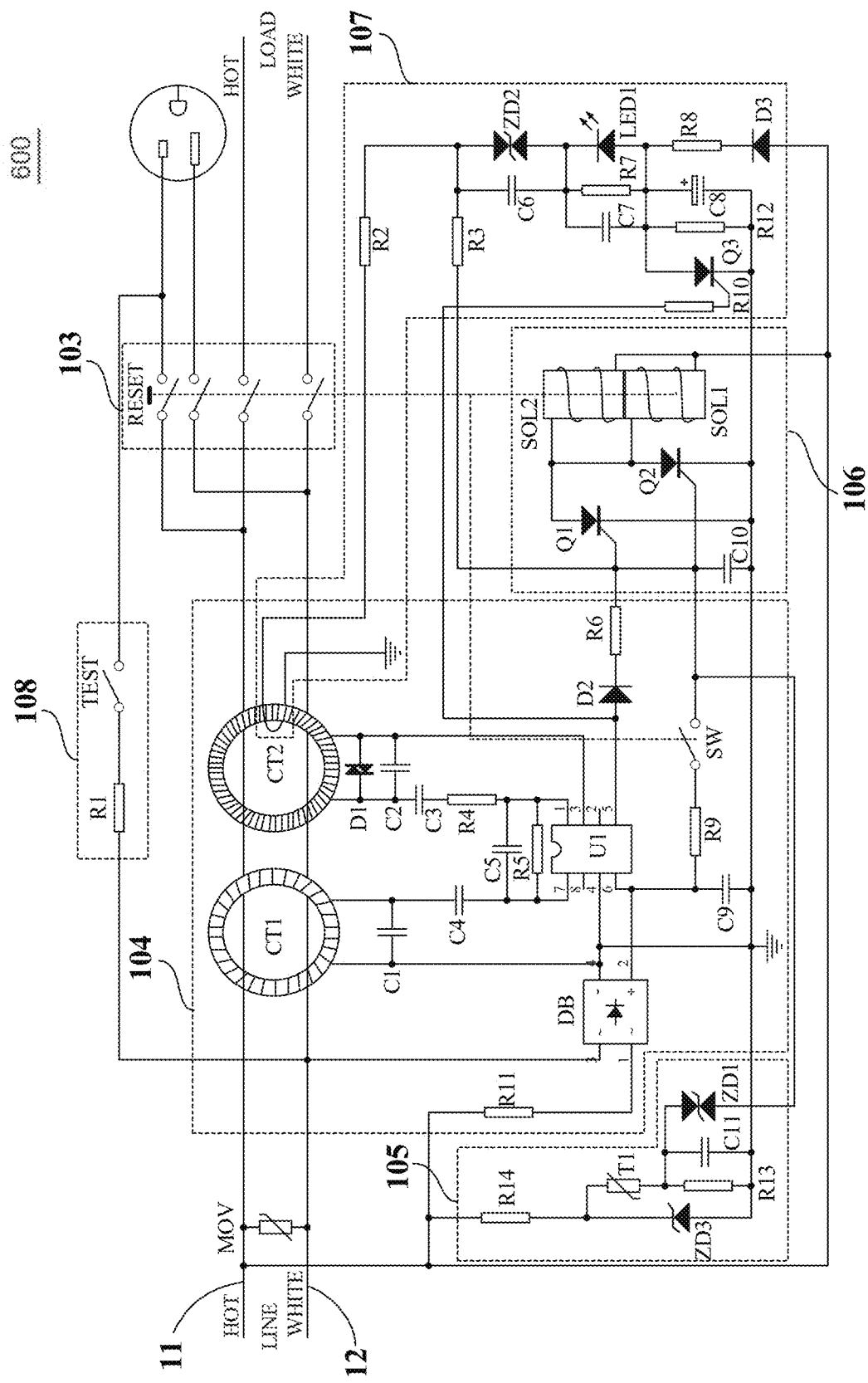
FIG. 6 is a circuit diagram of a leakage current detection and interruption device according to a fifth embodiment of the present invention.

FIG. 6 is a circuit diagram of a leakage current detection and interruption device 600 according to a fifth embodiment of the present invention. Compared to the embodiment in FIG. 3, a main difference is that in the embodiment of FIG. 6, the leakage current detection module 104 includes two current transformers CT1 and CT2, where CT1 is used to detect ground fault on the second current carrying line 12, and uses a full bridge rectifier DB to supply the working DC power. Further, the drive module 106 includes two solenoids SOL1 and SOL2. The over-temperature protection function, self-test function, and test function are similar to those of the embodiment of FIG. 3 and further descriptions are omitted.

When the leakage current detection and interruption device 600 is functioning normally, and the first current carrying line 11 or second current carrying line 12 has a leakage current, current transformer CT2 detects the leakage current and generates a corresponding induction signal at its secondary winding. Or, when the second current carrying line 12 has a ground fault, current transformer CT1 detects the ground fault and generates a corresponding induction signal at its secondary winding. Current transformers CT1 and CT2 are coupled to the leakage current detection chip U1 to transfer the induction signals to the leakage current detection chip U1 for processing. When the processed signal is higher than a preset threshold, pin 5 of the leakage current detection chip U1 outputs a high voltage level (the leakage fault signal); otherwise, it outputs a low voltage signal. The high voltage level at pin 5 is provided via diode D2 and resistor R6 to the control electrodes of silicon controlled rectifier Q1 and Q2, triggering silicon controlled rectifier Q1 and/or Q2 to become conductive. As a result, a current flows through the solenoid SOL, generating a sufficiently large electromagnetic force to drive the reset switch RESET of the switch module 103 to disconnect the electrical connection between the input and output ends, and to open the auxiliary switch SW at the same time.

Figure 7:
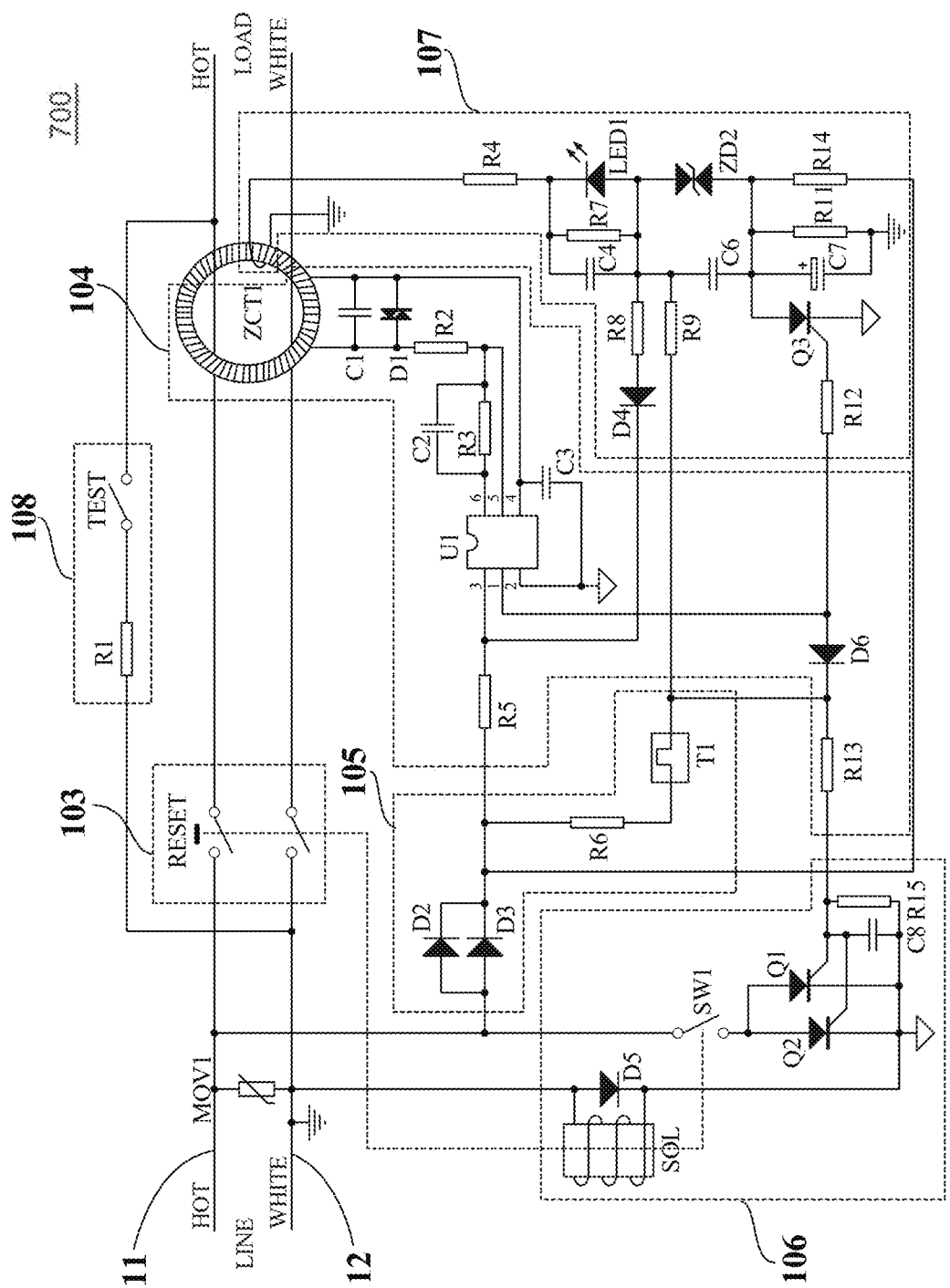
FIG. 7 is a circuit diagram of a leakage current detection and interruption device according to a sixth embodiment of the present invention.

FIG. 7 is a circuit diagram of a leakage current detection and interruption device 700 according to a sixth embodiment of the present invention. Compared to the embodiment in FIG. 2, a main difference is that in the embodiment of FIG. 7, the over-temperature protection module 105 includes diodes D2 and D3 coupled in parallel and resistor R6 and bimetal switch T1 coupled in series.

When the leakage current detection and interruption device 700 is functioning normally, e.g., there is no overloading or poor connection of the insertion plates, the temperature at the predefined location or predefined component is relatively low, so bimetal switch T1 is open. When the leakage current detection and interruption device 700 malfunctions, for example, when there is an overload in the circuit or the insertion plates have poor contact, causing the temperature at the predefined location and/or predefined component to rise, the two metal plates of the bimetal switch start to bend and deform. When the temperature at the predefined location and/or predefined component exceeds the temperature threshold, bimetal switch T1 is closed, so a current (over-temperature detection signal) flows through resistor R13 to trigger silicon controlled rectifiers Q1 and/or Q2 to conduct; as a result, a current flows through the solenoid SOL, generating a sufficiently large electromagnetic force to drive the reset switch RESET of the switch module 103 to disconnect the electrical connection between the input and output ends.

Figure 8:
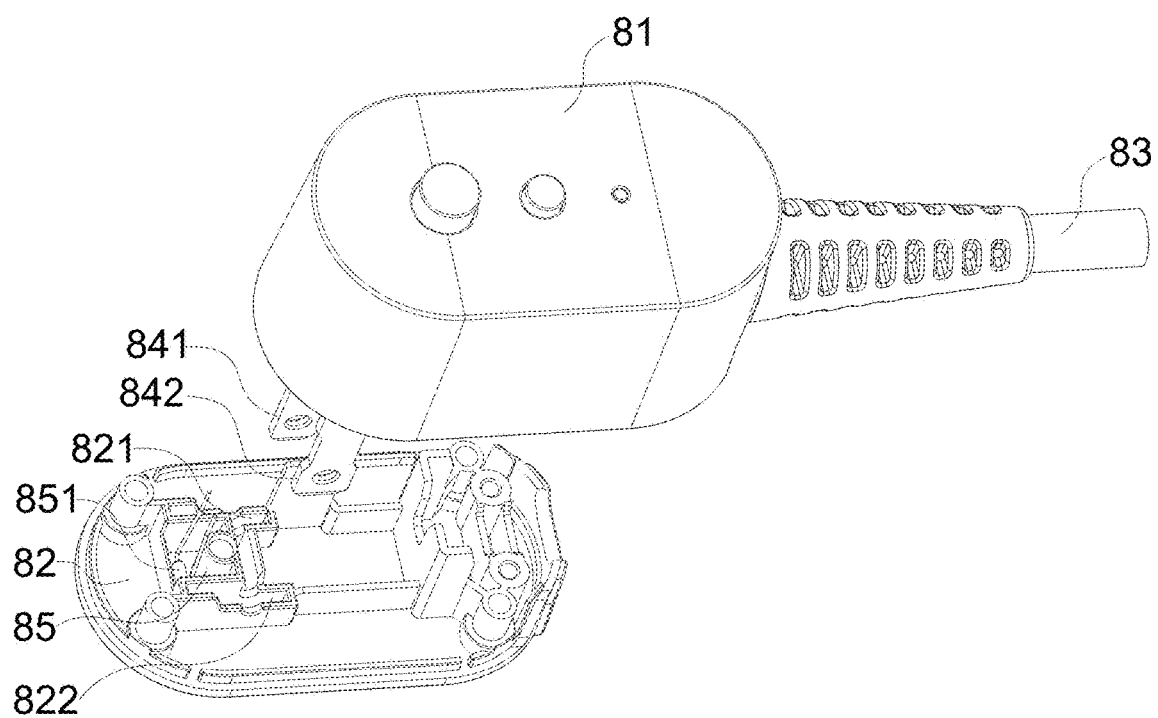
FIG. 8 is an exploded view showing an electrical connector according to an embodiment of the present invention.

FIG. 8 is an exploded view showing an electrical connector 800 according to an embodiment of the present invention. The electrical connector 800 includes an upper shell 81, a lower shell 82, a power cable 83, two insertion plates 841 and 842, and a printed circuit board PCB (not shown in FIG. 8). The various electrical components (such as those shown in the embodiments of FIGS. 2-7), except for the thermistor, are mounted on the PCB. The power cable 83 is coupled to the PCB.

As shown in FIG. 8, the PCB is covered by the upper shell 81. The lower shell 82 is provided with holes 821 and 822 corresponding to the locations of insertion plates 841 and 842, so that when the upper shell 81 and lower shell 82 are assembled together, insertion plates 841 and 842 respectively pass through holes 821 and 822 to be exposed to the outside of the lower shell 82, and configured to be inserted into a compatible power receptacle. Near holes 821 and 822, the lower shell 82 has a temperature sensing region 85 (i.e. the predefined location), where a thermistor 851 is located in the temperature sensing region 85 to sense the temperature near insertion plates 841 and 842. The leakage current detection and interruption device includes thermistor 851 and the PCB, and the two ends of thermistor 851 are coupled to appropriate electrical components on the PCB (such as in the circuit diagrams of FIGS. 2-7) to accomplish over-temperature protection.

Figure 9:
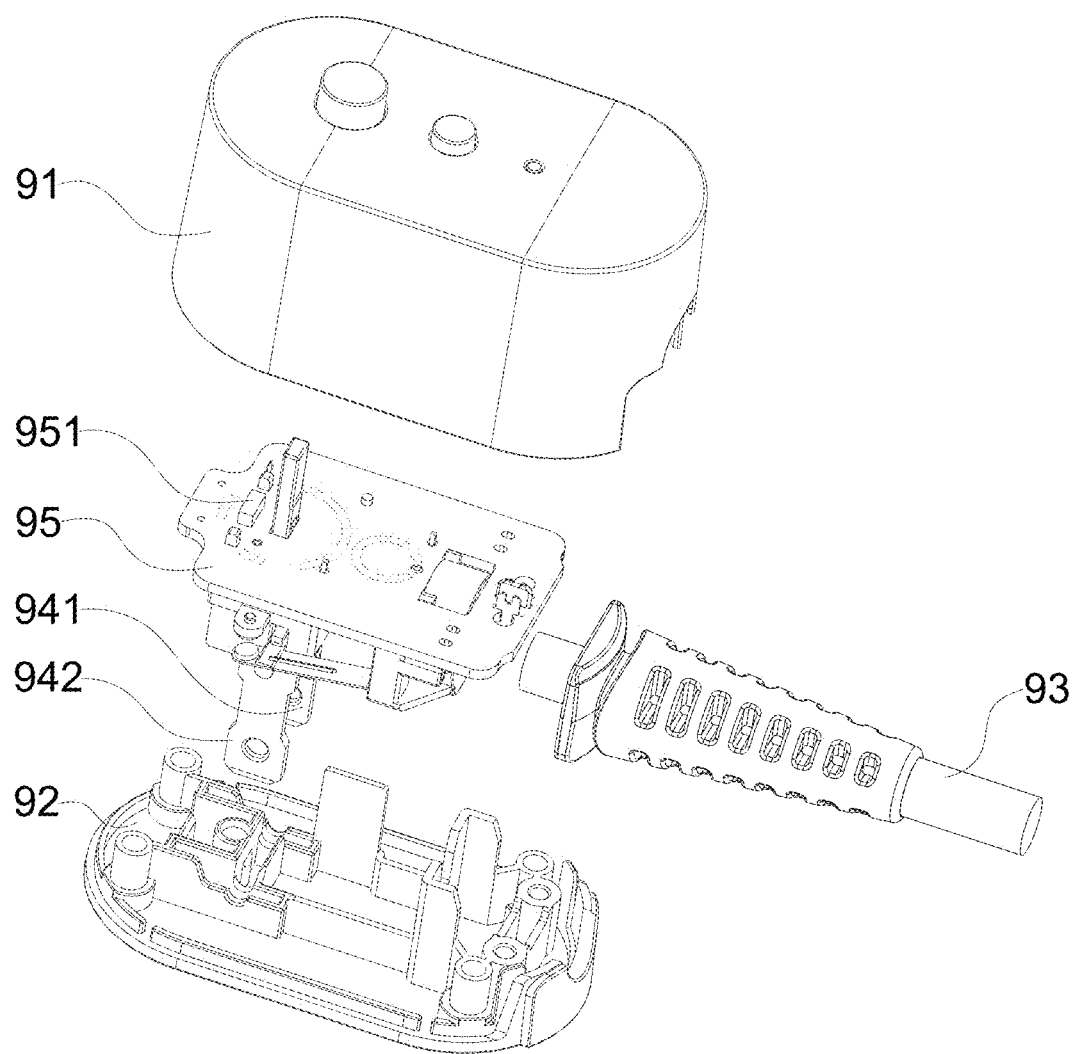
FIG. 9 is an exploded view showing an electrical connector according to another embodiment of the present invention.

FIG. 9 is an exploded view showing an electrical connector 900 according to another embodiment of the present invention. As shown in FIG. 9, the electrical connector 900 includes an upper shell 91, a lower shell 92, a power cable 93, two insertion plates 941 and 942, and a printed circuit board PCB 95. The various electrical components (such as those shown in the embodiments of FIGS. 2-7) are mounted on the PCB 95. The power cable 93 is coupled to the PCB 95.

Compared to the embodiment of FIG. 8, one main difference is that in the embodiment of FIG. 9, the thermistor 951 is mounted on the PCB 95 at a location near insertion plates 941 and 942 (i.e. the predefined location), to detect the temperature near insertion plates 941 and 942. The leakage current detection and interruption device includes thermistor 951 and PCB 95, and the two ends of thermistor 951 are coupled to appropriate electrical components (such as in the circuit diagrams of FIGS. 2-7) on PCB 95 to accomplish over-temperature protection.

While FIGS. 8 and 9 show a thermistor mounted in the shell or on the PCB of the electrical connector, it should be understood that in other embodiments, based on practical needs, other temperature sensors such as a diode or a bimetal switch may be used, and the thermistor or the other temperature sensors may be located at other predefined locations or on the surface of other predefined components.

In a second aspect, the present invention provides an electrical power connection device, which includes a body and a leakage current detection and protection device according to any one of the above embodiments disposed inside the body.

In a third aspect, the present invention provides an electrical appliance, which includes an electrical load, and an electrical power connection device coupled between a power supply and the load to supply power to the load, where the electrical power connection device employs a leakage current detection and protection device according to any one of the above embodiments.

While the present invention is described above using specific examples, these examples are only illustrative and do not limit the scope of the invention. It will be apparent to those skilled in the art that various modifications, additions and deletions can be made to the leakage current detection and interruption device of the present invention without departing from the spirit or scope of the invention.

The invention claimed is:

1. A leakage current detection and interruption device, comprising:
    a plurality of current carrying lines having an input end and an output end;
    a switch module, coupled on the plurality of current carrying lines between the input end and the output end, configured to connect or disconnect an electrical connection between the input end and the output end;
    a leakage current detection module, configured to detect a leakage current signal on the plurality of current carrying lines and to generate a leakage fault signal in response to detecting the leakage current signal;
    an over-temperature protection module, configured to detects a temperature of a predefined location and/or a predefined component of the leakage current detection and interruption device, and to generate an over-temperature fault signal when the detected temperature exceeds a predetermined temperature threshold;
    a drive module, coupled to the switch module, the leakage current detection module, and the over-temperature protection module, configured to receive the leakage fault signal and/or the over-temperature fault signal, and to drive the switch module to disconnect the electrical connection in response to the leakage fault signal and/or the over-temperature fault signal; and a self-test module, coupled to the leakage current detection module and the drive module, configured to periodically generate a simulated leakage current signal to detect a malfunction in the leakage current detection module and/or the drive module, and to generate a self-test fault signal in response to detecting the malfunction of the leakage current detection module and/or the drive module, wherein the over-temperature protection module includes at least one temperature sensor disposed at the predefined location and/or on a surface of the predefined component, and wherein the at least one temperature sensor includes a thermistor, the over-temperature protection module includes a first voltage-triggered sub-module and at least one voltage divider element, wherein the at least one voltage divider element is coupled in series with the thermistor and coupled to the first voltage-triggered sub-module, the first voltage-triggered sub-module is coupled to the drive module, wherein when the thermistor detects that the temperature of the predefined location or predefined component exceeds a temperature threshold, the at least one voltage divider element provides an over-temperature detection signal to the first voltage-triggered sub-module, and the first voltage-triggered sub-module generates the over-temperature fault signal in response thereto.

2. The leakage current detection and interruption device of claim 1, wherein the over-temperature protection module further includes a voltage regulator, where the first voltage divider element and the thermistor are coupled in series and then coupled in parallel with the voltage regulator.

3. The leakage current detection and interruption device of claim 1, wherein the first voltage-triggered sub-module includes a trigger diode, a transistor, a field-effect transistor, and/or a comparator.

4. The leakage current detection and interruption device of claim 1, wherein the at least one temperature sensor includes a bimetal switch coupled to the drive module, wherein the bimetal switch closes in response to detecting that the temperature at the predefined location and/or predefined component exceeds the predetermined temperature threshold to generate the over-temperature fault signal.

5. The leakage current detection and interruption device of claim 1, further comprising a monitor module, coupled to the leakage current detection module, wherein the monitor module includes a test switch and is configured to generate a simulated leakage fault signal in response to the test switch being operated, to detect whether the device is functioning normally.

6. An electrical power connection device, comprising:
a body; and
the leakage current detection and interruption device of claim 1, disposed inside the body.

7. An electrical appliance, comprising:
an electrical load; and
an electrical power connection device coupled between a power supply and the electrical load, configured to supply power to the electrical load, wherein the electrical power connection device includes the leakage current detection and interruption device of claim 1.

8. The leakage current detection and interruption device of claim 1, wherein the at least one temperature sensor includes a thermistor, a diode, and/or a bimetal switch.

9. A leakage current detection and interruption device, comprising:
a plurality of current carrying lines having an input end and an output end;
a switch module, coupled on the plurality of current carrying lines between the input end and the output end, configured to connect or disconnect an electrical connection between the input end and the output end;
a leakage current detection module, configured to detect a leakage current signal on the plurality of current carrying lines and to generate a leakage fault signal in response to detecting the leakage current signal;
an over-temperature protection module, configured to detects a temperature of a predefined location and/or a predefined component of the leakage current detection and interruption device, and to generate an over-temperature fault signal when the detected temperature exceeds a predetermined temperature threshold;
a drive module, coupled to the switch module, the leakage current detection module, and the over-temperature protection module, configured to receive the leakage fault signal and/or the over-temperature fault signal, and to drive the switch module to disconnect the electrical connection in response to the leakage fault signal and/or the over-temperature fault signal; and
a self-test module, coupled to the leakage current detection module and the drive module, configured to periodically generate a simulated leakage current signal to detect a malfunction in the leakage current detection module and/or the drive module, and to generate a self-test fault signal in response to detecting the malfunction of the leakage current detection module and/or the drive module, wherein the self-test module includes a second voltage-triggered sub-module and a first capacitor coupled in series, wherein the first capacitor is charged by the current carrying lines and configured to periodically generate the simulated leakage current signal via the second voltage-triggered sub-module.

10. The leakage current detection and interruption device of claim 9, wherein the over-temperature protection module includes at least one temperature sensor disposed at the predefined location and/or on a surface of the predefined component.

11. The leakage current detection and interruption device of claim 10, wherein the at least one temperature sensor includes a thermistor, a diode, and/or a bimetal switch.

12. The leakage current detection and interruption device of claim 9, wherein the second voltage-triggered sub-module includes a trigger diode, a transistor, a field-effect transistor, and/or a comparator.

13. The leakage current detection and interruption device of claim 9,
wherein the over-temperature protection module includes at least one temperature sensor disposed at the predefined location and/or on a surface of the predefined component, and
wherein the at least one temperature sensor includes a bimetal switch coupled to the drive module, wherein the bimetal switch closes in response to detecting that the temperature at the predefined location and/or predefined component exceeds the predetermined temperature threshold to generate the over-temperature fault signal.

14. The leakage current detection and interruption device of claim 9, further comprising a monitor module, coupled to the leakage current detection module, wherein the monitor module includes a test switch and is configured to generate a simulated leakage fault signal in response to the test switch being operated, to detect whether the device is functioning normally.

15. An electrical power connection device, comprising:
   a body; and
   the leakage current detection and interruption device of claim 9, disposed inside the body.

16. An electric appliance, comprising:
   an electrical load; and
   an electrical power connection device coupled between a power supply and the electrical load, configured to supply power to the electrical load, wherein the electrical power connection device includes the leakage current detection and interruption device of claim 9.

* * * * *